United States Patent [19]
Becker

[11] Patent Number: 5,170,240
[45] Date of Patent: Dec. 8, 1992

[54] INPUT PROTECTION STRUCTURE FOR INTEGRATED CIRCUITS

[75] Inventor: Burkhard Becker, Ismaning, Fed. Rep. of Germany

[73] Assignee: Siemens Aktiengesellschaft, Munich, Fed. Rep. of Germany

[21] Appl. No.: 769,173

[22] Filed: Sep. 30, 1991

[30] Foreign Application Priority Data

Sep. 28, 1990 [EP] European Pat. Off. ........ 90118728.6

[51] Int. Cl.⁵ .................. H01L 27/02; H01L 29/06; H01L 29/72; H02H 9/00
[52] U.S. Cl. ........................... 257/499; 361/56; 257/567; 257/570
[58] Field of Search ............... 357/46, 23.13, 34, 49, 357/51; 361/56, 91

[56] References Cited

FOREIGN PATENT DOCUMENTS 3616394 12/1986 Fed. Rep. of Germany .
2019645 10/1979 United Kingdom .
2176053 12/1986 United Kingdom .

*Primary Examiner*—Mark V. Prenty
*Attorney, Agent, or Firm*—Herbert L. Lerner; Laurence A. Greenberg

[57] ABSTRACT

An input protection structure for integrated circuits is connected in a semiconductor substrate between an input and an output for a reference potential. The input protection structure includes a first transistor acting as an input transistor and a second transistor acting as a trigger transistor. The input transistor and the trigger transistor are connected in a cascade. The input transistor and the trigger transistor have a common collector forming the input of the protection structure. The input transistor has an emitter connected to the output for the reference potential. An oxide isolation is provided for adjacent components.

3 Claims, 2 Drawing Sheets

INPUT PROTECTION STRUCTURE FOR INTEGRATED CIRCUITS

The invention relates to an input protection structure for integrated circuits, being connected in a semiconductor substrate between an input and an output for a reference potential, including a first transistor as an input transistor, a second transistor as a control transistor, and oxide isolation of adjacent components.

Integrated circuits require secure protection against electrostatic discharges (ESD protection) and they are provided with input protection structures for that purpose. Such input protection structures, which contain two transistors connected together, are known and are described, for instance, in German Published, Non-Prosecuted Application DE-OS 36 16 394. However, thus far such input protection structures have been used only in bipolar integrated circuits, in which adjacent components are isolated from one another by a PN isolation.

It is accordingly an object of the invention to provide an input protection structure for bipolar integrated circuits that are provided with an oxide isolation of adjacent components, which overcomes the hereinafore-mentioned disadvantages of the heretofore-known devices of this general type and which assures fast and reliable protection against electrostatic discharges of both polarities.

With the foregoing and other objects in view there is provided, in accordance with the invention, an input protection structure for integrated circuits connected in a semiconductor substrate between an input and an output for a reference potential, comprising a first transistor acting as an input transistor, a second transistor acting as a control transistor, the input transistor and the control transistor being connected in a cascade, the input transistor and the control transistor having a common collector forming the input of the protection structure, the input transistor having an emitter connected to the output for the reference potential, and oxide isolation for adjacent components.

In accordance with another feature of the invention, the control transistor has a floating base.

In accordance with a concomitant feature of the invention, there is provided an integrated resistor through which the base of the control transistor is connected to ground.

Other features which are considered as characteristic for the invention are set forth in the appended claims. Although the invention is illustrated and described herein as embodied in an input protection structure for integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
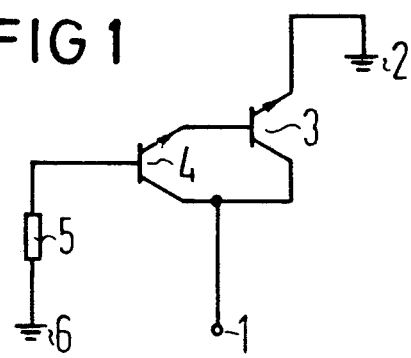
FIG. 1 is a substitute circuit diagram of an input protection structure.
Figure 2:
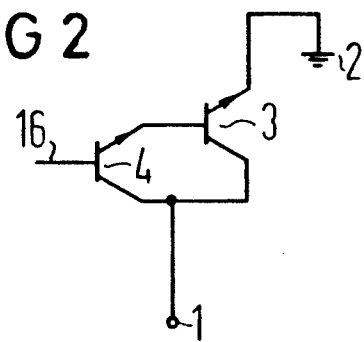
FIG. 2 is a substitute circuit diagram of a further input protection structure.

Referring now to the figures of the drawing in detail and first, particularly, to FIGS. 1 and 2 thereof, there is seen a protection structure, which is formed of a first transistor acting as an input transistor 3 and a second transistor acting as a control transistor 4, located between an input terminal 1 of an integrated circuit and an output 2 for a reference potential, in particular ground potential. The input transistor 3 and the control transistor 4 are connected in a cascade. Such a connection of two npn transistors is known, specifically as an amplifier circuit referred to as a Darlington circuit. A common collector of the input transistor 3 and the control transistor 4 forms the input 1 of the protection structure. This input is connected in parallel with a component to be protected. The emitter of the input transistor 3 is connected to the terminal 2 for a reference potential. The terminal 2 is suitably acted upon by ground potential, or ground.

In the example of FIG. 1, the base of the control transistor 4 is connected to the ground potential or ground 6, through an integrated resistor 5.

In the example of FIG. 2, the base of the control transistor is constructed as a so-called floating or open base 16 that is non-grounded or potential-free.

Figure 3:
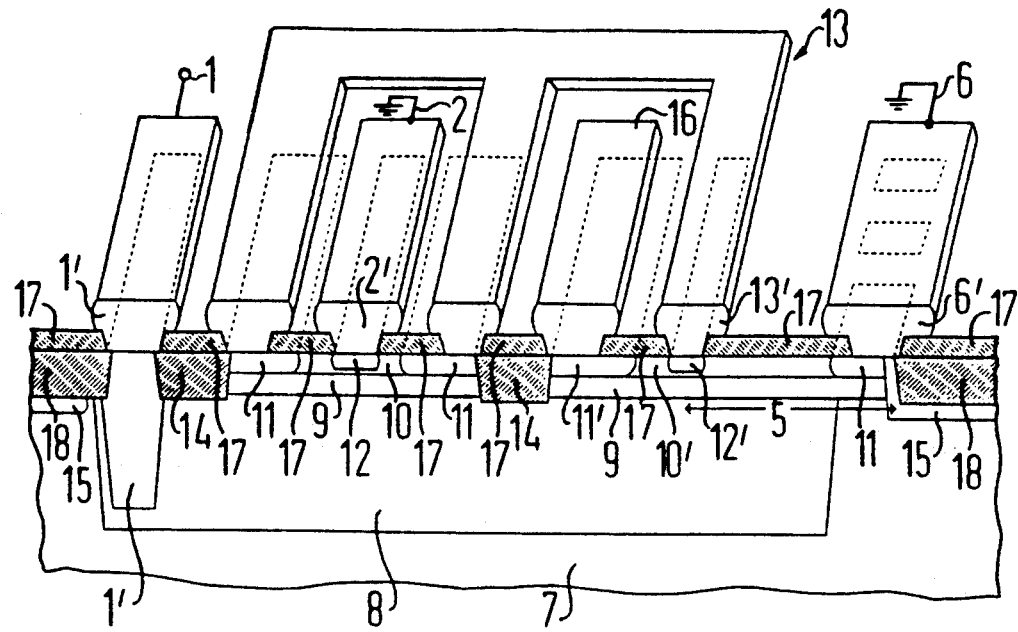
FIG. 3 is a fragmentary, diagrammatic, perspective view of the input protection structure of FIG. 1.
Figure 4:
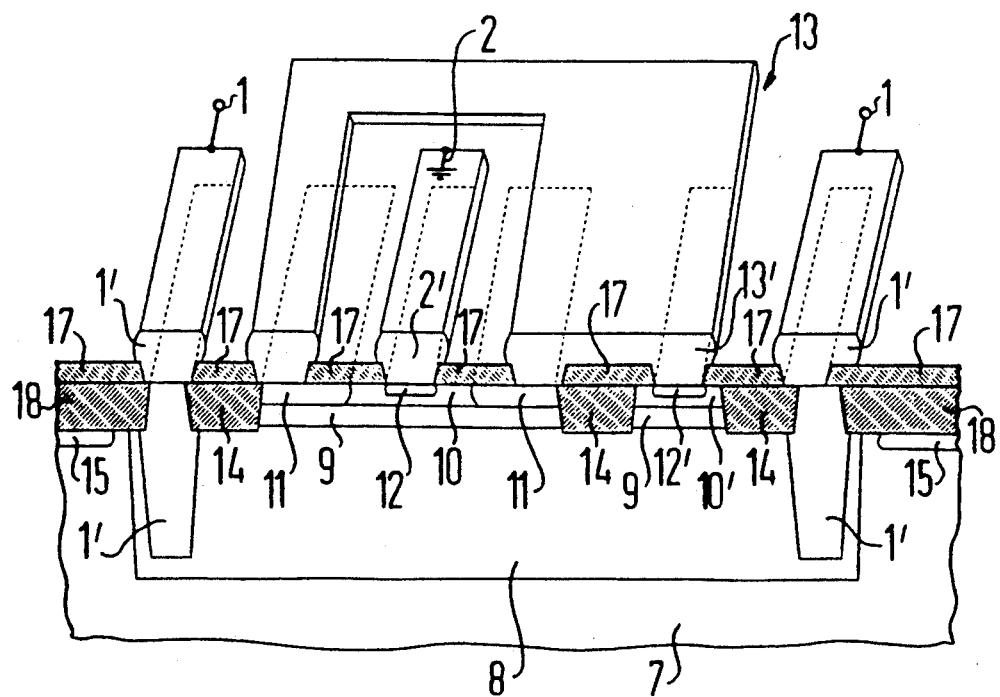
FIG. 4 is a fragmentary, perspective view of the input protection structure of FIG. 2.

The input protection structures shown in FIGS. 3 and 4, which were described in terms of the substitute circuit diagrams of FIGS. 1 and 2, are produced in a semiconductor substrate 7, which is suitably a p-conducting semiconductor substrate, in a plurality of known method steps. Except for the integrated substrate contact 6 (ground contact) of the structure of FIG. 3, both structures are completely underlaid with a highly doped, n-conducting buried layer 8. Both structures are defined by an oxide isolation 18 for adjacent components, and this isolation may be underlaid with a highly doped p-conducting zone, known as a channel stopper 15.

One (FIG. 3) or two (FIG. 4) collector deep-diffusion terminals 1' form the input 1 of the applicable structure. In other words, they are connected parallel to the component to be protected. In the exemplary embodiment shown in FIG. 4, it is also possible to make do with only one collector deep-diffusion terminal. The use of two terminals 1' for the input 1 represents a particularly advantageous embodiment of the protection structure, for reasons of symmetry.

The input transistors 3 (FIGS. 1 and 2) of both protection structures shown in FIGS. 3 and 4 have the same structure, namely n+ collector deep-diffusion terminal 1', n+ buried layer 8, n-epitaxial zone 9, p-base diffusion zone 10 with p+ base contact zones 11, and an n+ emitter diffusion zone 12. Thus the structure of the input transistors is equivalent to that of a standard npn transistor of a corresponding processing line being employed.

A metal connection 13 provides electrical contact for both the base contact zones 11 of the input transistor 3 and an emitter diffusion zone 12' of the control transistor 4 (FIGS. 1, 2). The emitter diffusion zone 12, is located in a base zone 10, (base of the control transistor 4). Base contact zones 11, and their metal contact 16 in the base-to-emitter region of the control transistor, provide for homogeneity of the course of field intensity and current and thus for increased ESD load capacity. The base-to-emitter regions of the control and input transistors are separated from one another by means of an oxide isolation 14 resting on the common buried layer 8.

The integrated resistor 5 of FIG. 1 is formed in the protection structure shown in FIG. 3 by the base diffusion zone 10' of the control transistor 4, which zone is connected diffusionally with the substrate 7. The integrated substrate terminal (ground terminal 6), formed of the base contact diffusion zone 11, the channel stopper 15, and the metal contact 16, should be connected to the ground terminal of a circuit to be protected.

An isolating layer 17 is applied to the surface of the two semiconductor systems shown in FIGS. 3 and 4. The isolating layer 17 is structured to produce connection openings for the input terminals 1', the output terminals 2', the metal connection 13, 13', the substrate or ground terminal 6, 6' (FIGS. 1 and 3), and the open base terminal 16 (FIG. 3).

The ESD protection effected with the input protection structure according to the invention is attained as follows:

a) for negative pulses: the diversion of the pulse takes place through the junction between the buried layer and the substrate, and in the case of FIG. 1 through the junction between the collector and the base of the control transistor 4 as well as through the integrated resistor 5, to ground 6. In that case, the presence of two diversion paths provides for a homogeneous distribution of current over the surface area of the component.

The structure of FIGS. 2 and 4 compensates for the absence of a second diversion path (collector-to-base path of the control transistor 4), because it is a more-compact structure.

In both cases, destruction of the sensitive emitter-to-base paths, which are polarized in the depletion direction, is largely prevented as a result of the homogeneous distribution of current or field intensity.

b) for positive pulses: the derivation of the pulse is effected by means of a breakdown of the collector-to-emitter path of the input transistor 3, which is controlled by a U(CER) or U(CEO) breakdown of the control transistor 4.

The control transistor 4 supplies the base of the input transistor 3, in the case of U(CEO) or U(CER) breakdown, with a base current, whereupon normal transistor operation commences. The input transistor thus drains the pulse to ground. The response speed and the current carrying capacity of the transistor circuit assures the protection of components that are located parallel to one another. The protection of the input transistor itself is assured by the transistor action with a controlled base. Destruction of the control transistor is counteracted by the series circuit of the diode paths (collector-to-base and base-to-emitter of the control transistor, and base-to-emitter of the input transistor). As compared with a simple diode path, a current limitation is attained in this case.

In the case of FIGS. 1 and 3, the breakdown of the collector-to-base depletion layer of the control transistor through the integrated resistor 5 not only makes the current course homogeneous but also distributes the drain of the pulse to a plurality of paths.

Signal voltages can be processed up to the U(CEO) limit of the applicable processing line. The breakdown voltage of the structure can be raised up to the U(CER) limit by reducing the distance between the emitter and base contact diffusion of the control transistor.

I claim:

1. An input protection structure for integrated circuits connected in a semiconductor substrate between an input to be protected and an output for a reference potential, comprising a first transistor acting as an input transistor, a second transistor acting as a control transistor, said input transistor and said control transistor being connected in a cascade, said input transistor and said control transistor having a common collector forming the input of the protection structure, said input transistor having an emitter connected to the output for the reference potential, and oxide isolation for adjacent components.

2. The input protection structure according to claim 1, wherein said control transistor has a floating base.

3. The input protection structure according to claim 1, including an integrated resistor through which the base of said control transistor is connected to ground.

* * * * *